United States Patent
Hong et al.

(10) Patent No.: US 9,541,608 B2
(45) Date of Patent: *Jan. 10, 2017

(54) APPARATUS AND METHOD FOR MEASURING INSULATION RESISTANCE OF BATTERY

(71) Applicant: LG CHEM, LTD., Seoul (KR)

(72) Inventors: Hyun-Ju Hong, Daejeon (KR); Jin-Su Jang, Seoul (KR)

(73) Assignee: LG CHEM, LTD., Seoul (KR)

( * ) Notice: Subject to any disclaimer, the term of this patent is extended or adjusted under 35 U.S.C. 154(b) by 575 days.

This patent is subject to a terminal disclaimer.

(21) Appl. No.: 14/097,941

(22) Filed: Dec. 5, 2013

(65) Prior Publication Data

US 2014/0095093 A1   Apr. 3, 2014

Related U.S. Application Data

(63) Continuation of application No. PCT/KR2013/002499, filed on Mar. 26, 2013.

(30) Foreign Application Priority Data

Mar. 26, 2012   (KR) .................. 10-2012-0030527
Mar. 26, 2013   (KR) .................. 10-2013-0031939

(51) Int. Cl.
   *G01R 31/36*   (2006.01)
   *G01R 21/00*   (2006.01)
   (Continued)

(52) U.S. Cl.
   CPC ........... *G01R 31/3627* (2013.01); *G01R 31/02* (2013.01); *G01R 31/1227* (2013.01);
   (Continued)

(58) Field of Classification Search
   CPC ..... G01R 31/3606; G01R 27/18; G01R 31/02; G01R 31/3627; G01R 31/1227; H01M 10/48
   (Continued)

(56) References Cited

U.S. PATENT DOCUMENTS 8,779,784 B2 *   7/2014   Yang ...................... G01R 27/16
                                                  324/426
9,024,769 B2 *   5/2015   Hong ................... G01R 31/025
                                                  340/636.1
(Continued)

FOREIGN PATENT DOCUMENTS

EP   1289094 A1   3/2003
EP   2333568 A1   6/2011
(Continued)

OTHER PUBLICATIONS

International Search Report, issued in PCT/KR2013/002499, dated Jul. 15, 2013.

*Primary Examiner* — An Do
(74) *Attorney, Agent, or Firm* — Birch, Stewart, Kolasch & Birch, LLP

(57) ABSTRACT

Disclosed is an apparatus for measuring an insulation resistance that may calculate each of a cathode terminal-side insulation resistance value and an anode terminal-side insulation resistance value of a battery. The apparatus for measuring an insulation resistance according to the present disclosure forms different first and second circuits by selectively connecting an insulation resistance measurement unit to a cathode terminal or an anode terminal of the battery, and calculates a cathode terminal-side insulation resistance value and an anode terminal-side insulation resistance value from first and second insulation detection voltages applied to the insulation resistance measurement unit and simultaneous circuit equations derived from the first and the second
(Continued)

circuits. Accordingly, quantitative insulation resistance values of the cathode terminal and the anode terminal of the battery may be each obtained.

16 Claims, 7 Drawing Sheets

(51) Int. Cl.
    *G01R 31/02*     (2006.01)
    *G01R 31/12*     (2006.01)
    *H01M 10/48*     (2006.01)
    *G01R 27/18*     (2006.01)

(52) U.S. Cl.
    CPC .............. *H01M 10/48* (2013.01); *G01R 27/18* (2013.01); *G01R 31/3606* (2013.01)

(58) Field of Classification Search
    USPC ................. 702/57, 58, 60, 63; 324/430, 551
    See application file for complete search history.

(56) References Cited

U.S. PATENT DOCUMENTS

| | | |
|---|---|---|
| 2005/0264264 A1 | 12/2005 | Yano et al. |
| 2008/0224687 A1 | 9/2008 | Breese et al. |
| 2009/0289640 A1 | 11/2009 | Kawamura et al. |
| 2011/0006777 A1 | 1/2011 | Park et al. |
| 2014/0021961 A1* | 1/2014 | Yamada ............... G01R 31/025 324/503 |

FOREIGN PATENT DOCUMENTS

| | | |
|---|---|---|
| JP | 7-203601 A | 8/1995 |
| JP | 2006-220520 A | 8/2006 |
| KR | 10-2008-0093559 A | 10/2008 |
| KR | 10-2009-0024573 A | 3/2009 |
| KR | 10-2010-0104139 A | 9/2010 |
| KR | 10-2010-0105954 A | 10/2010 |
| WO | WO 2012/036498 A2 | 3/2012 |

* cited by examiner

APPARATUS AND METHOD FOR MEASURING INSULATION RESISTANCE OF BATTERY

CROSS-REFERENCE TO RELATED APPLICATION

The present application is a continuation of International Application No. PCT/KR2013/002499 filed Mar. 26, 2013, which claims priorities to Korean Patent Application No. 10-2012-0030527 filed in the Republic of Korea on Mar. 26, 2012 and Korean Patent Application No. 10-2013-0031939 filed in the Republic of Korea on Mar. 26, 2013, the disclosures of which are incorporated herein by reference.

TECHNICAL FIELD

The present disclosure relates to an apparatus and method for measuring an insulation resistance of a battery, and more particularly, to an apparatus and method for measuring an insulation resistance of a battery that may measure an insulation resistance of a battery employed in a battery power supply system requiring high voltage such as an electric vehicle or a hybrid vehicle.

BACKGROUND ART

Recently, due to the exhaustion of fossil energy and environmental pollution, the interest in electric products, which may operate with electric energy instead of fossil energy, is growing more and more.

Accordingly, with the increasing development and consumption of mobile devices, electric vehicles, hybrid vehicles, power storage devices, uninterrupted power supplies, or the like, the consumption of secondary batteries as energy sources are rapidly increasing as well as its various forms thereof. Therefore, secondary batteries are being studied very actively to cope with such diverse demands.

Meanwhile, a device using a high-output high-capacity battery such as, an electric vehicle or a hybrid vehicle needs to maintain good insulation condition between the battery and the device. If not, a leakage current occurs, causing various problems. For reference, a leakage current causes an unexpected discharge of the battery or malfunction of electronic elements equipped in the device. Also, a device using a high voltage battery such as, an electric vehicle may give a fatal electric shock to a person. Accordingly, there is an urgent demand for a solution for accurately measuring an insulation resistance of a battery in the technical field pertaining to the present disclosure.

DISCLOSURE

Technical Problem

The present disclosure is designed under consideration of the conventional art, and an object of the present disclosure is to provide an apparatus and method for measuring an insulation resistance of a battery.

Technical Solution

To achieve the object, an apparatus for measuring an insulation resistance according to the present disclosure includes a first insulation resistance measurement unit and a second insulation resistance measurement unit connected to a cathode terminal and an anode terminal of a battery, respectively, a first switch and a second switch to form different first and second circuits by selectively connecting the first insulation resistance measurement unit and the second insulation resistance measurement unit to the cathode terminal and the anode terminal, respectively, a voltage detection unit to sense a first insulation detection voltage and a second insulation detection voltage applied to the first insulation resistance measurement unit and the second insulation resistance measurement unit, and a control unit to calculate a cathode terminal-side insulation resistance value and an anode terminal-side insulation resistance value from the first insulation detection voltage and the second insulation detection voltage and simultaneous circuit equations derived from the first circuit and the second circuit.

Preferably, the second insulation resistance measurement unit further includes a direct current (DC) power applying unit.

Preferably, the control unit calculates the cathode terminal-side insulation resistance value and the anode terminal-side insulation resistance value using the following Equation:

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2}$$

in which $V_{Bat}$ denotes a battery voltage value, $V_1$ denotes a first insulation detection voltage, $V_2$ denotes a second insulation detection voltage, $V_{DC}$ denotes a voltage value of a DC power applying unit, $R_1$ denotes a first resistance value, $R_2$ denotes a second resistance value, $R_{Leak(+)}$ denotes a cathode terminal-side insulation resistance value, and $R_{Leak(-)}$ denotes an anode terminal-side insulation resistance value.

Preferably, the control unit determines, as a final insulation resistance value, a smaller insulation resistance value among the calculated cathode terminal-side insulation resistance value and the calculated anode terminal-side insulation resistance value. Also, the control unit may judge whether an insulation breakdown occurs in the battery by comparing the final insulation resistance value to a preset standard insulation resistance value.

The apparatus for measuring an insulation resistance according to the present disclosure may further include a memory unit to store the battery voltage value, the voltage value of the DC power applying unit, the first resistance value, the second resistance value, and the standard insulation resistance value.

Also, the apparatus for measuring an insulation resistance according to the present disclosure may further include a transmission unit to form a communication interface with an external device, and the control unit may transmit information about whether an insulation breakdown occurs to the external device through the transmission unit. In this instance, the external device may be a battery analysis device or a control device of a system equipped with a battery.

Also, the apparatus for measuring an insulation resistance according to the present disclosure may further include a warning unit to visually or auditorily output whether an insulation breakdown occurs, and when an insulation breakdown is sensed, the control unit may output a warning signal to provide a warning of the insulation breakdown visually or auditorily through the warning unit.

The object of the present disclosure may also be achieved by an apparatus for measuring an insulation resistance, including an insulation resistance measurement unit connected to a cathode terminal or an anode terminal of a battery, a switch unit to form different first and second circuits by selectively connecting the insulation resistance measurement unit to the cathode terminal and the anode terminal of the battery, a voltage detection unit to sense a first insulation detection voltage and a second insulation detection voltage applied to the insulation resistance measurement unit, and a control unit to calculate a cathode terminal-side insulation resistance value and an anode terminal-side insulation resistance value from the first insulation detection voltage and the second insulation detection voltage and simultaneous circuit equations derived from the first circuit and the second circuit.

In this case, the switch unit forms different first and second circuits by selectively connecting one end of the insulation resistance measurement unit to the cathode terminal or the anode terminal of the battery and selectively connecting the other end of the insulation resistance measurement unit to a ground or a DC power applying unit. For this, the switch unit may include a multiplexer (MUX).

To achieve the object, a method of measuring an insulation resistance according to the present disclosure measures an insulation resistance of a battery using a first insulation detection voltage and a second insulation detection voltage detected by a first insulation resistance measurement unit and a second insulation resistance measurement unit connected to a cathode terminal and an anode terminal of the battery respectively, and the method includes (a) sensing the first insulation detection voltage after forming a first circuit by connecting the first insulation resistance measurement unit to the cathode terminal of the battery, (b) sensing the second insulation detection voltage after forming a second circuit by connecting the second insulation resistance measurement unit to the anode terminal of the battery, and (c) calculating a cathode terminal-side insulation resistance value and an anode terminal-side insulation resistance value from the first insulation detection voltage and the second insulation detection voltage and simultaneous circuit equations derived from the first circuit and the second circuit.

The object of the present disclosure may also be achieved by a method of measuring an insulation resistance of a battery using a first insulation detection voltage and a second insulation detection voltage detected by an insulation resistance measurement unit connected to a cathode terminal or an anode terminal of the battery, the method including (a) detecting the first insulation detection voltage after forming a first circuit by connecting the insulation resistance measurement unit to the cathode terminal of the battery, (b) detecting the second insulation detection voltage after forming a second circuit by connecting the insulation resistance measurement unit to the anode terminal of the battery, and (c) calculating a cathode terminal-side insulation resistance value and an anode terminal-side insulation resistance value from the first insulation detection voltage and the second insulation detection voltage and simultaneous circuit equations derived from the first circuit and the second circuit.

Advantageous Effects

According to an aspect of the present disclosure, quantitative insulation resistance values of each of a cathode terminal and an anode terminal of a battery may be obtained. Accordingly, it can be determined whether a breakdown of the insulation condition of the battery occurs, and at which electrode the insulation breakdown phenomenon occurs.

According to another aspect of the present disclosure, a safety accident caused by a leakage current may be prevented by selecting, as a final insulation resistance value, a smaller insulation resistance value among the cathode terminal-side insulation resistance value and the anode terminal-side insulation resistance value.

DESCRIPTION OF DRAWINGS

The accompanying drawing illustrates a preferred embodiment of the present disclosure and together with the foregoing disclosure, serves to provide further understanding of the technical spirit of the present disclosure. However, the present disclosure is not construed as being limited to the drawing.

MODE FOR DISCLOSURE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

Figure 1:
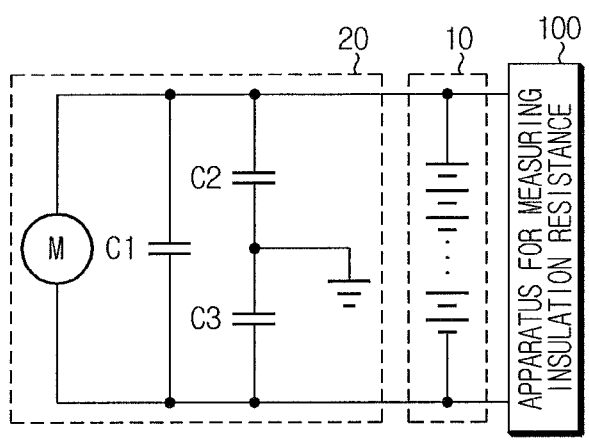
FIG. 1 is a schematic circuit diagram illustrating an equivalent circuit of a battery power supply system equipped with an apparatus for measuring an insulation resistance according to the present disclosure.

FIG. 1 is a schematic circuit diagram illustrating an equivalent circuit of a battery power supply system equipped with an apparatus 100 for measuring an insulation resistance according to the present disclosure.

As shown in FIG. 1, a battery power supply system includes a battery 10 that is a cell assembly including a plurality of cells connected in serial and/or parallel, and a load 20 supplied with power outputted from the battery 10, and the apparatus 100 for measuring an insulation resistance according to the present disclosure is connected to a cathode terminal and an anode terminal of the battery 10.

The battery 10 is an electrical energy storage means, and has a structure of a plurality of rechargeable unit cells electrically connected to be able to recharge. The unit cell is an electric double-layer capacitor including an ultra-capacitor or a secondary battery such as a lithium ion battery, a lithium polymer battery, a Ni—Cd battery, a Ni-MH battery, a Ni—Zn battery, and the like. For example, if the battery 10 is a battery for use in an electric vehicle or a hybrid vehicle, the battery 10 outputs a high voltage direct current (DC) power of 200V or higher. However, the present disclosure is not limited by a battery type, an output voltage, a charge capacity, and the like.

The load 20 may include a driving motor M of an electric vehicle or a hybrid vehicle, a DC to DC converter (not shown), and the like. Also, a DC/DC cap (C1) and a Y-cap (C2, C3) may be provided in the load 20 to remove noise generated from the driving motor (M). The DC/DC cap (C1) removes high frequency noise generated from the driving motor (M) by employing a high capacity capacitor, and the Y-cap (C2, C3) removes low frequency noise generated from the driving motor (M).

The apparatus 100 for measuring an insulation resistance according to the present disclosure is connected to each of the cathode terminal and the anode terminal of the battery 10 to measure an insulation resistance of the battery 10. A detailed description of a configuration of the apparatus 100 for measuring an insulation resistance is provided below with reference to FIG. 2.

Figure 2:
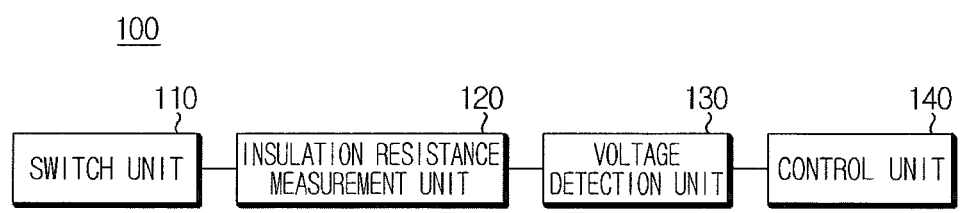
FIG. 2 is a schematic block diagram illustrating a configuration of an apparatus for measuring an insulation resistance according to the present disclosure.

FIG. 2 is a schematic block diagram illustrating a configuration of the apparatus 100 for measuring an insulation resistance according to the present disclosure.

Referring to FIG. 2, the apparatus 100 for measuring an insulation resistance according to an exemplary embodiment of the present disclosure includes a switch unit 110, an insulation resistance measurement unit 120, a voltage detection unit 130, and a control unit 140.

The insulation resistance measurement unit 120 is connected to the cathode terminal and the anode terminal of the battery 10, and thereby voltage of the battery 10 is applied.

The switch unit 110 selectively connects the insulation resistance measurement unit 120 to the cathode terminal and the anode terminal of the battery 10 to form different first and second circuits.

Figure 3:
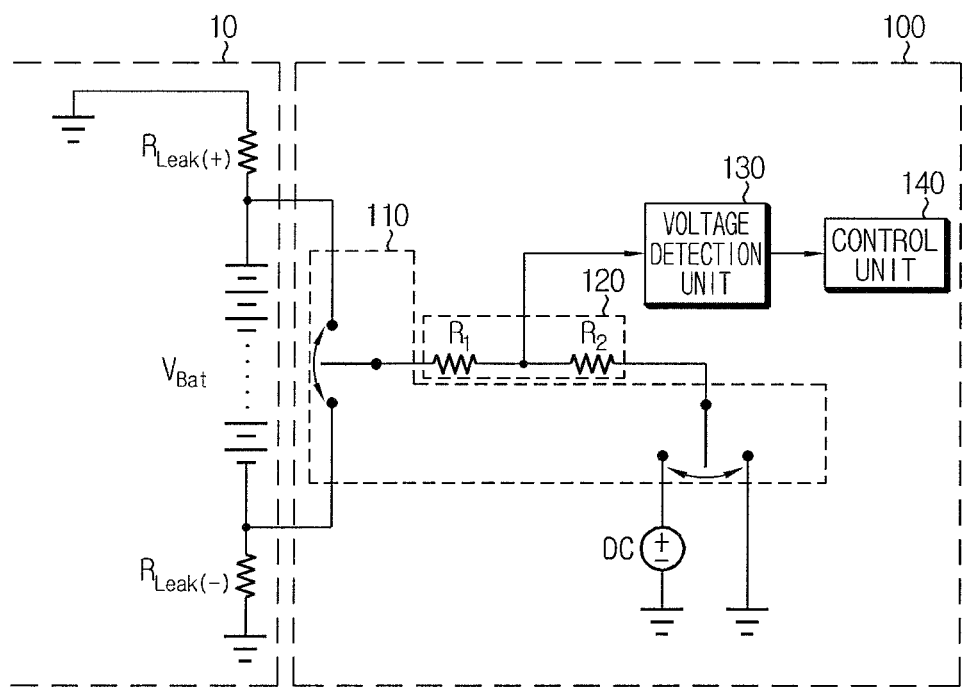
FIG. 3 is a schematic circuit diagram illustrating an equivalent circuit of an apparatus for measuring an insulation resistance according to an exemplary embodiment of the present disclosure.

FIG. 3 is a schematic circuit diagram illustrating an equivalent circuit of the apparatus 100 for measuring an insulation resistance according to an exemplary embodiment of the present disclosure.

Referring to FIG. 3, the switch unit 110 according to the present disclosure forms different first and second circuits by selectively connecting one end of the insulation resistance measurement unit 120 to the cathode terminal or the anode terminal of the battery 10 and selectively connecting the other end of the insulation resistance measurement unit 120 to a ground or a DC power applying unit (DC).

For this, the switch unit 110 may include a multiplexer (MUX). A multiplexer refers to a device that selects one input when inputs from several lines are concentrated at a single line. A multiplexer is also known as a selector. When a multiplexer is used as the switch unit 110, one end of the insulation resistance measurement unit 120 may be selectively connected to the cathode terminal or the anode terminal of the battery 10 based on a signal inputted into the multiplexer. Also, the other end of the insulation resistance measurement unit 120 may be selectively connected to the ground or the DC power applying unit (DC) based on a signal inputted into the multiplexer.

Figure 4:
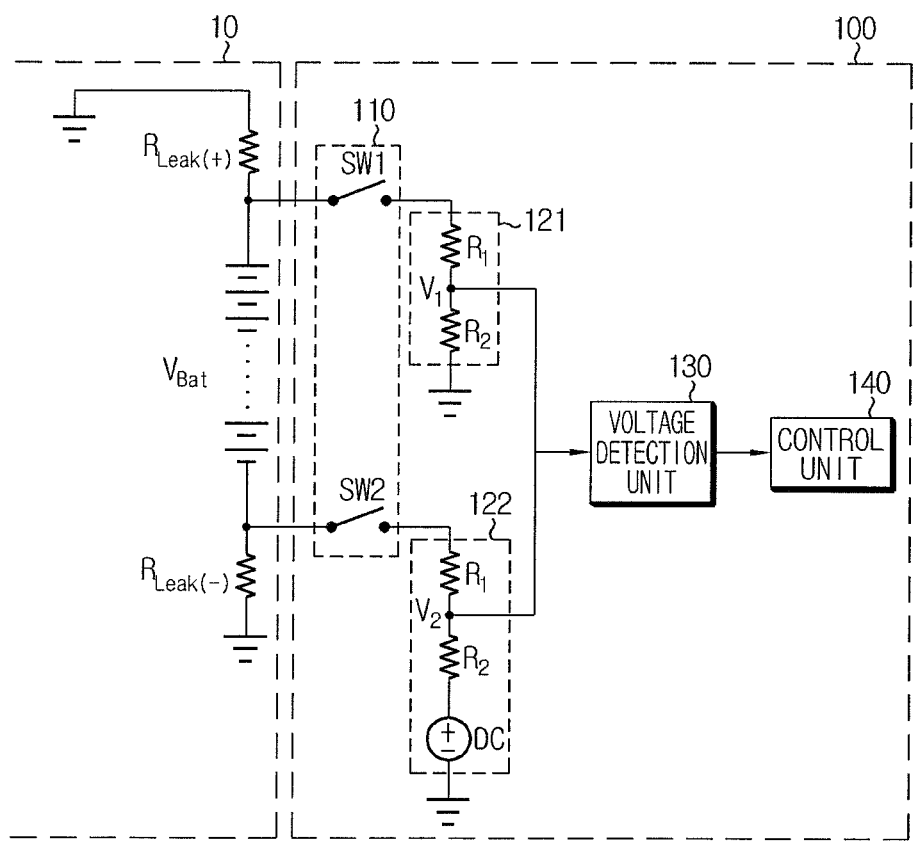
FIG. 4 is a schematic circuit diagram illustrating an equivalent circuit of an apparatus for measuring an insulation resistance according to another exemplary embodiment of the present disclosure.

FIG. 4 is a schematic circuit diagram illustrating an equivalent circuit of the apparatus 100 for measuring an insulation resistance according to another exemplary embodiment of the present disclosure.

Referring to FIG. 4, the insulation resistance measurement unit 120 of the apparatus 100 for measuring an insulation resistance according to another exemplary embodiment of the present disclosure is classified into a first insulation resistance measurement unit 121 and a second insulation resistance measurement unit 122. Also, the switch unit 110 is classified into a first switch (SW1) and a second switch (SW2).

When compared to the embodiment of FIG. 3, the embodiment of FIG. 4 is an embodiment in which the insulation resistance measurement unit 120 connected to the cathode and anode terminals of the battery 10 is classified for convenience of description and understanding. In the embodiment of FIG. 4, the switch unit 110 is also classified for convenience of description and understanding. Hereinafter, in the description of the apparatus 100 for measuring an insulation resistance according to the present disclosure, the description is provided based on the embodiment of FIG. 4. However, it should be understood that the embodiment of FIG. 4 is just one example of the apparatus 100 for measuring an insulation resistance according to the present disclosure. Also, although FIG. 4 shows that the first insulation resistance measurement unit 121 and the second insulation resistance measurement unit 122 include only a resistance element, it should be understood that a known electrical component capable of measuring the voltage of the battery 10 being applied may be added to and substituted for a resistance element.

The first switch (SW1) connects the first insulation resistance measurement unit 121 to the cathode terminal of the battery 10. The first switch (SW1) performs an ON/OFF operation by a control signal from the control unit 140. Thus, the first insulation resistance measurement unit 121 is connected to the cathode terminal of the battery 10 by the control signal from the control unit 140. In the specification, to help the understanding of the present disclosure, a circuit formed by connecting the first insulation resistance measurement unit 121 to the cathode terminal of the battery 10 is designated as a first circuit. When the first circuit is formed, the voltage applied from the side of the cathode terminal of the battery is applied to the first insulation resistance measurement unit 121.

The second switch (SW2) connects the second insulation resistance measurement unit 122 to the anode terminal of the battery 10. The second switch (SW2) performs an ON/OFF operation by a control signal from the control unit 140. Thus, the second insulation resistance measurement unit 122 is connected to the anode terminal of the battery 10 by the control signal from the control unit 140. In the specification, to help the understanding of the present disclosure, a circuit formed by connecting the second insulation resistance measurement unit 122 to the anode terminal of the battery 10 is designated as a second circuit. When the second circuit is formed, the voltage applied from the side of the anode terminal of the battery is applied to the second insulation resistance measurement unit 122.

Preferably, the second insulation resistance measurement unit 122 further includes a DC power applying unit (DC). This applies a positive voltage to the second insulation resistance measurement unit 122 when the second circuit is formed, so that the voltage detection unit 130 may sense a none-zero voltage value.

Preferably, the first insulation resistance measurement unit 121 and the second insulation resistance measurement unit 122 include a plurality of resistance elements. A range of voltage applied to each resistance element by the battery 10 may be set by arbitrarily selecting resistance values for the plurality of resistance elements. In an embodiment, the range of voltage to be sensed by the voltage detection unit 130 may be set to be less than or equal to 5V by properly selecting the value of the resistance element.

Although FIG. 4 shows an embodiment in which the first and second insulation resistance measurement units 121 and 122 include a first resistance $R_1$ and a second resistance $R_2$, the present disclosure is not limited to the illustrated embodiment. Also, it should be understood that the first and second insulation resistance measurement units 121 and 122 are shown as equally including the first resistance $R_1$ and the second resistance $R_2$ in the embodiment of FIG. 4 to help the understanding of the present disclosure and simplify the drawings. It is obvious to a person having an ordinary skill in the art that a number of resistance elements, a resistance value of each resistance element, and the like may be variously set.

The voltage detection unit 130 senses an insulation detection voltage applied to the first and second insulation resistance measurement units 121 and 122. The insulation detection voltage is a voltage applied to the second resistance $R_2$. The insulation detection voltage is used to calculate an insulation resistance value of the battery 10. In the specification, a voltage applied to the second resistance $R_2$ included in the first resistance measurement unit 121 when the first circuit is formed is designated as a first insulation detection voltage $V_1$. And, a voltage applied to the second resistance $R_2$ included in the second resistance measurement unit 122 when the second circuit is formed is designated as a second insulation detection voltage $V_2$. The voltage detection unit 130 outputs signals corresponding to the first and second insulation detection voltages $V_1$ and $V_2$ to the control unit 140.

The control unit 140 outputs a signal for controlling the ON/OFF operation of the first switch SW1 and the second switch SW2. When the control unit 140 sends a control signal to enable the first switch SW1 to perform an ON operation, the control unit 140 controls the second switch SW2 to perform an OFF operation. In contrast, when the control unit 140 sends a control signal to enable the second switch SW2 to perform an ON operation, the control unit 140 controls the first switch SW1 to perform an OFF operation. Through this, the control unit 140 enables the first and second insulation resistance measurement units 121 and 122 to connect to the cathode terminal and the anode terminal of the battery 10 at different points in time. Meanwhile, the designation of the first switch SW1 and the second switch SW2 is just for distinguishing one from another, and does not represent an order of output of the control signal from the control unit 140 or an operation sequence of the present disclosure.

The control unit 140 receives signals corresponding to the first and second insulation detection voltages $V_1$ and $V_2$ received from the voltage detection unit 130. Then, the control unit 140 calculates a cathode terminal-side insulation resistance value $R_{Leak(+)}$ and an anode terminal-side insulation resistance value $R_{Leak(-)}$ from the first and second insulation detection voltages $V_1$ and $V_2$ and simultaneous circuit equations derived from the first and second circuits. A detailed description of an algorithm for calculating the insulation resistance value through the simultaneous circuit equations will be provided below.

Meanwhile, the voltage of the battery 10 is expressed as $V_{Bat}$, and the cathode terminal-side insulation resistance $R_{Leak(+)}$ and the anode terminal-side insulation resistance $R_{Leak(-)}$ for the cathode terminal and the anode terminal of the battery 10 indicate an imaginary resistance value representing the insulation condition of the battery 10. Accordingly, when a breakdown of the insulation condition of the battery 10 occurs, measured values of the cathode terminal-side insulation resistance $R_{Leak(+)}$ and the anode terminal-side insulation resistance $R_{Leak(-)}$ will be low, and through this, it may be interpreted that a leakage current occurs.

Hereinafter, an algorithm for calculating the cathode terminal-side insulation resistance value $R_{Leak(+)}$ and the anode terminal-side insulation resistance value $R_{Leak(-)}$ in the apparatus 100 for measuring an insulation resistance according to the present disclosure is described in detail with reference to FIGS. 5 and 6.

Figure 5:
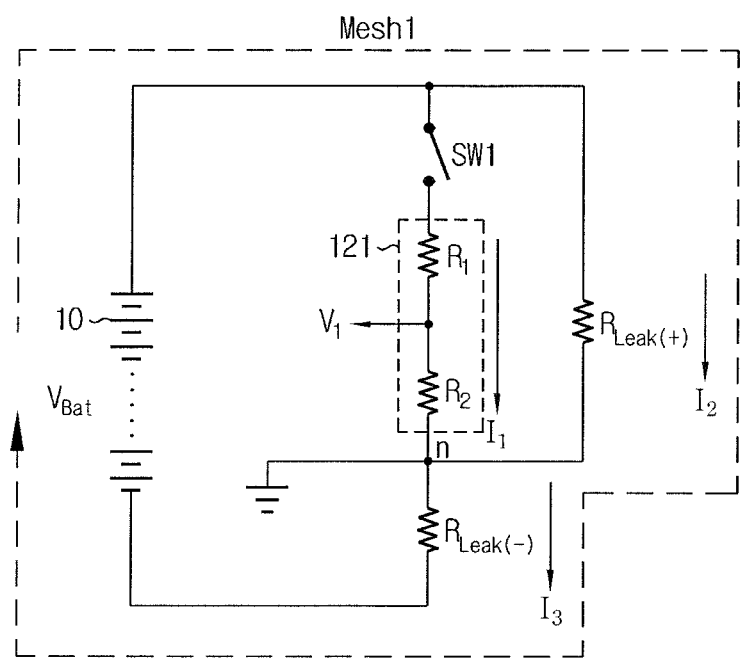
FIG. 5 is a schematic circuit diagram illustrating a first circuit.

FIG. 5 is a schematic circuit diagram illustrating the first circuit.

Referring to FIG. 5, current flowing across the first insulation resistance measurement unit 121 is indicated by $I_1$, current flowing across the cathode terminal-side insulation resistance $R_{Leak(+)}$ is indicated by $I_2$, and current flowing across the anode terminal-side insulation resistance $R_{Leak(-)}$ is indicated by $I_3$.

First, when a value for the first insulation detection voltage $V_1$ is represented in terms of $I_1$, the first insulation detection voltage $V_1$ is given by Equation 1 below.

$$V_1 = I_1 R_2 \qquad \text{<Equation 1>}$$

If Equation 1 is arranged with respect to $I_1$, Equation 1 is expressed like Equation 2 below.

$$I_1 = \frac{V_1}{R_2} \qquad \text{<Equation 2>}$$

Also, since the first insulation resistance measurement unit 121 is in parallel with the cathode terminal-side insulation resistance $R_{Leak(+)}$, a relation like Equation 3 below is established.

$$I_1 R_1 + V_1 = I_2 R_{Leak(+)} \qquad \text{<Equation 3>}$$

If Equation 3 is arranged with respect to $I_2$ and Equation 2 is substituted therein, Equation 3 may be expressed like Equation 4 below.

$$\begin{aligned} I_2 &= \frac{I_1 R_1 + V_1}{R_{Leak(+)}} \\ &= \frac{\left(\frac{V_1}{R_2}\right) R_1 + V_1}{R_{Leak(+)}} \end{aligned} \qquad \text{<Equation 4>}$$

Meanwhile, if Kirchhoff's current law is applied based on a node n connected to a ground, Equation 5 below is derived.

$$I_1+I_2=I_3 \qquad \text{<Equation 5>}$$

If Equations 2 and 4 are substituted into Equation 5 and then arranged with respect to $I_3$, Equation 5 may be expressed like Equation 6 below.

$$I_3 = \frac{V_1}{R_2} + \frac{\left(\frac{V_1}{R_2}\right)R_1 + V_1}{R_{Leak(+)}} \qquad \text{<Equation 6>}$$

Meanwhile, if Kirchhoff's voltage law is applied based on Mesh 1 of FIG. 3, an equation of the first row included in Equation 7 below is derived. Also, if the equation of the first row is arranged using $I_2$ and $I_3$ obtained through Equations 4 and 6, an equation of the last row included in Equation 7 below may be derived.

$$V_{Bat} = I_2 R_{Leak(+)} + I_3 R_{Leak(-)} \qquad \text{<Equation 7>}$$

$$V_{Bat} = \left(\frac{\left(\frac{V_1}{R_2}\right)R_1 + V_1}{R_{Leak(+)}}\right)R_{Leak(+)} + \left(\frac{V_1}{R_2} + \frac{\left(\frac{V_1}{R_2}\right)R_1 + V_1}{R_{Leak(+)}}\right)R_{Leak(-)}$$

$$V_{Bat} = \left(\frac{V_1}{R_2}\right)R_1 + V_1 + \left(\frac{V_1}{R_2} + \frac{\left(\frac{V_1}{R_2}\right)R_1 + V_1}{R_{Leak(+)}}\right)R_{Leak(-)}$$

The equation of the last row included in Equation 7 above is one of the simultaneous circuit equations for calculating the cathode terminal-side insulation resistance value $R_{Leak(+)}$ and the anode terminal-side insulation resistance value $R_{Leak(-)}$, and is used together with other circuit equations described below.

Figure 6:
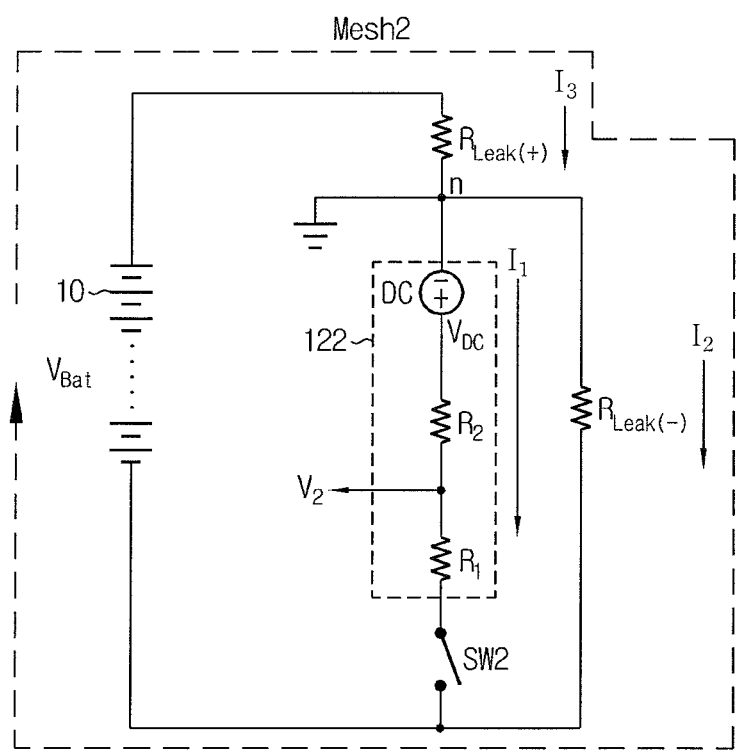
FIG. 6 is a schematic circuit diagram illustrating a second circuit.

FIG. 6 is a schematic circuit diagram illustrating the second circuit.

Referring to FIG. 6, current flowing across the second resistance measurement unit 122 is indicated by $I_1$, current flowing across the anode terminal-side insulation resistance $R_{Leak(-)}$ is indicated by $I_2$, and current flowing across the cathode terminal-side insulation resistance $R_{Leak(+)}$ is indicated by $I_3$.

First, if a value for the second insulation detection voltage $V_2$ is expressed in terms of $I_1$, the second insulation detection voltage $V_2$ is given by Equation 8 below.

$$V_2 = V_{DC} - I_1 R_2 \qquad \text{<Equation 8>}$$

If Equation 8 is arranged with respect to $I_1$, Equation 8 may be expressed like Equation 9 below.

$$I_1 = \frac{V_{DC} - V_2}{R_2} \qquad \text{<Equation 9>}$$

Also, since the second insulation resistance measurement unit 122 is in parallel with the anode terminal-side insulation resistance $R_{Leak(-)}$, a relation of Equation 10 below is established.

$$I_1 R_1 - V_2 = I_2 R_{Leak(-)}$$

If Equation 10 is arranged with respect to $I_2$ and Equation 9 is substituted therein, Equation 10 may be expressed like Equation 11 below.

$$I_2 = \frac{I_1 R_1 - V_2}{R_{Leak(-)}} \qquad \text{<Equation 11>}$$

$$= \frac{\left(\frac{V_{DC} - V_2}{R_2}\right)R_1 - V_2}{R_{Leak(+)}}$$

Meanwhile, if Kirchhoff's current law is applied based on a node n connected to a ground, Equation 12 below is derived.

$$I_3 = I_1 + I_2 \qquad \text{<Equation 12>}$$

If Equations 9 and 11 are substituted into Equation 12 and then arranged with respect to $I_3$, Equation 12 may be expressed like Equation 13 below.

$$I_3 = \frac{V_{DC} - V_2}{R_2} + \frac{\left(\frac{V_{DC} - V_2}{R_2}\right)R_1 - V_2}{R_{Leak(-)}} \qquad \text{<Equation 13>}$$

Meanwhile, if Kirchhoff's voltage law is applied based on Mesh 2 of FIG. 6, an equation of the first row included in Equation 14 below is derived. Also, if the equation of the first row is arranged using $I_2$ and $I_3$ obtained through Equations 11 and 13, an equation of the last row included in Equation 14 below may be derived.

$$V_{Bat} = I_2 R_{Leak(-)} + I_3 R_{Leak(+)} \qquad \text{<Equation 14>}$$

$$V_{Bat} = \left(\frac{\left(\frac{V_{DC} - V_2}{R_2}\right)R_1 - V_2}{R_{Leak(-)}}\right)R_{Leak(-)} +$$

$$\left(\frac{V_{DC} - V_2}{R_2} + \frac{\left(\frac{V_{DC} - V_2}{R_2}\right)R_1 - V_2}{R_{Leak(-)}}\right)R_{Leak(+)}$$

$$V_{Bat} = \left(\frac{V_{DC} - V_2}{R_2}\right)R_1 - V_2 +$$

$$\left(\frac{V_{DC} - V_2}{R_2} + \frac{\left(\frac{V_{DC} - V_2}{R_2}\right)R_1 - V_2}{R_{Leak(-)}}\right)R_{Leak(+)}$$

The equation of the last row included in Equation 14 above is one of the simultaneous circuit equations for calculating the cathode terminal-side insulation resistance value $R_{Leak(+)}$ and the anode terminal-side insulation resistance value $R_{Leak(-)}$. Accordingly, if solutions to the cathode terminal-side insulation resistance $R_{Leak(+)}$ and the anode terminal-side insulation resistance $R_{Leak(-)}$ are obtained by simultaneously using the equation of the last row included in Equation 7 and the equation of the last row included in Equation 14, Equation 15 may be obtained like below.

$$R_{Leak(+)} = \frac{(V_{Bat} - A)(V_{Bat} - C) - AC}{D(V_{Bat} - A) + BC} \qquad \text{<Equation 15>}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

-continued $$\therefore C = \left(\frac{V_{DC} - V_2}{R_2}\right) R_1 - V_2$$

$$\therefore D = \frac{V_{DC} - V_2}{R_2}$$

In Equation 15, the voltage value $V_{Bat}$ of the battery, the resistance values of the first resistance $R_1$ and the second resistance $R_2$, and the voltage value $V_{DC}$ of the DC power applying unit are known, and the first insulation detection voltage $V_1$ and the second insulation detection voltage $V_2$ can be obtained through the voltage detection unit 130. Accordingly, the control unit 140 may quantitatively calculate each of the cathode terminal-side insulation resistance value $R_{Leak(+)}$ and the anode terminal-side insulation resistance value $R_{Leak(-)}$ of the battery 10 by substituting the first insulation detection voltage $V_1$ and the second insulation detection voltage $V_2$ received from the voltage detection unit 130 into Equation 15.

If the cathode terminal-side insulation resistance value $R_{Leak(+)}$ and the anode terminal-side insulation resistance value $R_{Leak(-)}$ of the battery 10 are each calculated, an electrode in which an insulation breakdown occurs may be correctly detected.

Preferably, the control unit 140 determines, as a final insulation resistance value, a smaller resistance value among the cathode terminal-side insulation resistance value $R_{Leak(+)}$ and the anode terminal-side insulation resistance value $R_{Leak(-)}$ of the battery 10. Also, the control unit 140 determines whether an insulation breakdown occurs by determining whether the final insulation resistance value is smaller than a pre-stored standard insulation resistance value through comparing the insulation resistance values. As described in the foregoing, by judging whether an insulation breakdown occurs based on a smaller resistance value among the cathode terminal-side insulation resistance value $R_{Leak(+)}$ and the anode terminal-side insulation resistance value $R_{Leak(-)}$ of the battery 10, a safety accident risk caused by a leakage current will be reduced.

The apparatus 100 for measuring an insulation resistance according to the present disclosure may further include a memory unit (not shown) to store the voltage value of the battery, the voltage value $V_{DC}$ of the DC power applying unit, the first resistance value R1 and the second resistance value R2 of the insulation resistance measurement unit, and the standard insulation resistance value.

The memory unit may be inside or outside of the control unit 140, and may be connected to the control unit 140 by a well-known means. The memory unit is a high-capacity storage medium known as being capable of recording and erasing data, such as a semiconductor device or a hard disk, for example, random access memory (RAM), read-only memory (ROM), electrical erasable programmable read-only memory (EEPROM), and the like, and encompasses any device capable of storing information regardless of a device type and is not limited to a specific memory device.

The apparatus 100 for measuring an insulation resistance according to the present disclosure may further include a transmission unit (not shown) that forms a communication interface with an external device. In this case, the control unit 140 transmits information about whether an insulation breakdown occurs to the external device through the transmission unit. In this instance, the external device may be a battery analysis device or a control device of a system equipped with a battery.

The apparatus 100 for measuring an insulation resistance according to the present disclosure may further include a warning unit (not shown) to visually or auditorily output whether an insulation breakdown occurs. In this case, when an insulation breakdown phenomenon occurs, the control unit 140 may output a warning signal to visually or auditorily notify the occurrence of the insulation breakdown through the warning unit.

For example, the warning unit may include a light emitting diode (LED), a liquid crystal display (LCD), an alarm, or combinations thereof. In this case, the warning unit may provide a user with a warning of an occurrence of a leakage current caused by the insulation breakdown by flashing LED lights, outputting a warning message through an LCD, or generating an alarm buzzer sound. Also, the warning unit may be included in the external device connected with the transmission unit. However, the present disclosure is not limited in this regard. Also, the LED, the LCD, and the alarm unit are just an example of the warning unit, and it is obvious to a person having an ordinary skill in the art that various types of visual or auditory alarm devices may be used as the warning unit.

To calculate the insulation resistance value using Equation 15 described in the foregoing and execute various control logics, the control unit 140 may include a processor, an application-specific integrated circuit (ASIC), other chipsets, a logic circuit, a register, a communication modem, a data processing device, and the like, known in the art pertaining to the present disclosure. Also, when the control logic is implemented as software, the control unit 140 may be implemented as an assembly of program modules. In this instance, the program module may be stored in the memory unit and executed by the processor.

Hereinafter, a method of measuring an insulation resistance corresponding to the operation mechanism of the above apparatus is described. However, the description is provided using the apparatus 100 for measuring an insulation resistance shown in FIG. 4, and a repeated description such as the configuration of the apparatus 100 for measuring an insulation resistance and the like is omitted herein.

Figure 7:
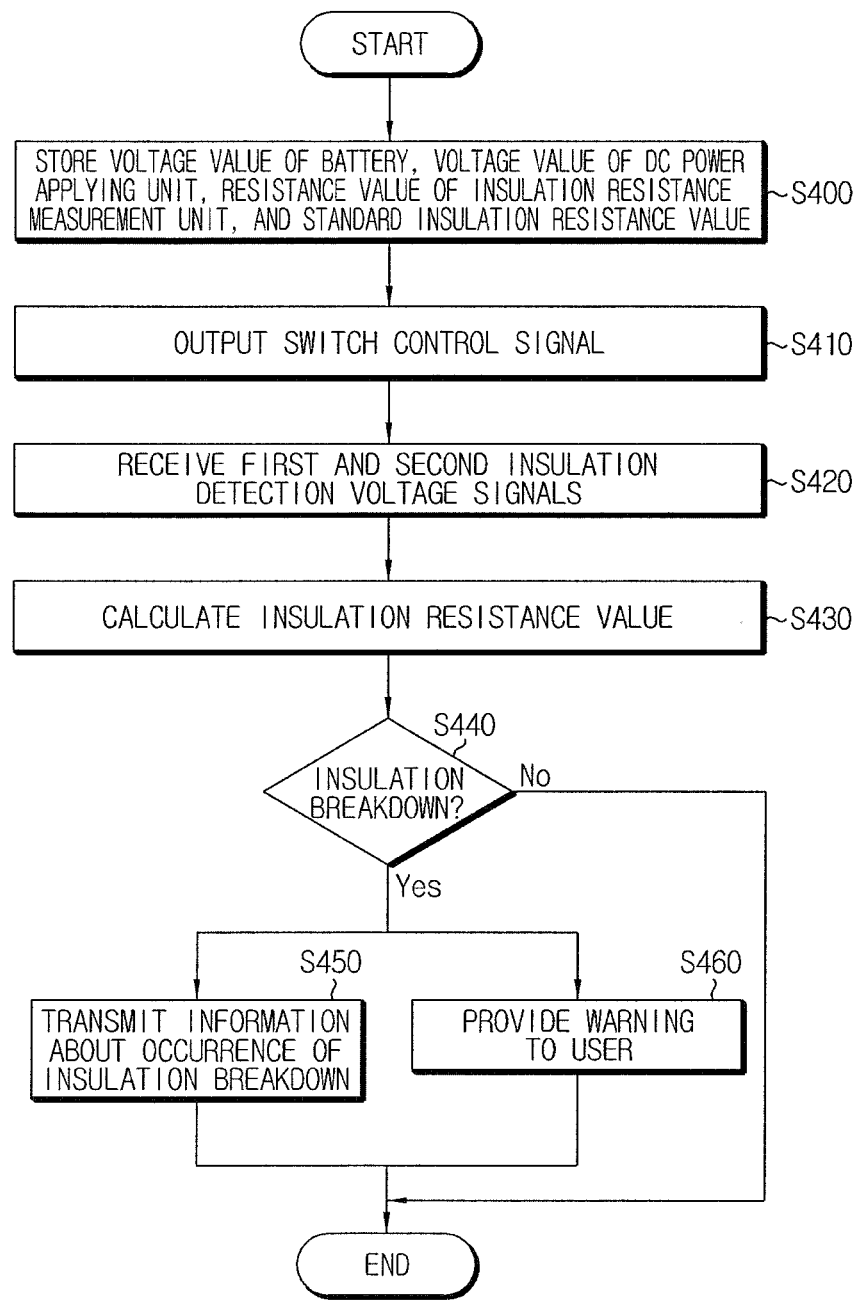
FIG. 7 is a flowchart illustrating a method of measuring an insulation resistance according to an exemplary embodiment of the present disclosure.

FIG. 7 is a flowchart illustrating a method of measuring an insulation resistance according to an exemplary embodiment of the present disclosure.

First, in S400, the voltage value $V_{Bat}$ of the battery, the voltage value $V_{DC}$ of the DC power applying unit, the first resistance value R1 and the second resistance value R2 of the insulation resistance measurement unit, and the standard insulation resistance value are stored in the memory unit. The stored values are used to measure an insulation resistance by substituting into Equation 15 along with the insulation detection voltage. Here, the voltage value $V_{Bat}$ of the battery may be a value measured using a voltage detection circuit (not shown).

Next, in S410, the control unit 140 outputs a switch control signal. This step is a step of connecting the first and second insulation resistance measurement units 121 and 122 to the cathode and anode terminals of the battery at different times. As described in the foregoing, when the control unit 140 sends a control signal to perform an ON operation on the first switch SW1 to form the first circuit, the control unit 140 controls the second switch SW2 to perform an OFF operation. In contrast, when the control unit 140 sends a control signal to perform an ON operation on the second switch SW2 to form the second circuit, the control unit 140 controls the first switch SW1 to perform an OFF operation Next, in S420, signals corresponding to the voltages applied to each second resistance $R_2$, that is, the insulation detection voltages $V_1$ and $V_2$ are received from the voltage detection unit 130. The signal received when the first circuit is formed is a signal corresponding to the first insulation detection voltage $V_1$ and the signal received when the second circuit is formed is a signal corresponding to the second insulation detection voltage $V_2$, and the signals are received by the control unit 140. Then, the control unit 140 calculates the cathode terminal-side insulation resistance value $R_{Leak(+)}$ and the anode terminal-side insulation resistance value $R_{Leak(-)}$ from simultaneous circuit equations using the received first and second insulation detection voltages $V_1$ and $V_2$. The simultaneous circuit equations used to calculate the insulation resistance values are described in detail through Equations 1 through 15, and thus a repeated description is omitted herein.

In S440, a smaller resistance value among the cathode terminal-side insulation resistance value $R_{Leak(+)}$ and the anode terminal-side insulation resistance value $R_{Leak(-)}$ calculated in S430 is determined as a final insulation resistance value. Also, whether an insulation breakdown occurs is judged by determining whether the final insulation resistance value is smaller than a pre-stored standard insulation resistance value through comparing the insulation resistance values.

Preferably, when the insulation breakdown has occurred (YES in S440), S450 proceeds to transmit information about whether the insulation breakdown occurs to an external device, or S460 proceeds to provide a warning to a user.

The method of measuring an insulation resistance described in the foregoing corresponds to a method for the apparatus 100 for measuring an insulation resistance shown in FIG. 3. Specifically, in S410, when the first circuit is formed, the switch unit 110 controls to connect one end of the insulation resistance measurement unit 120 to the cathode terminal of the battery and connect the other end of the insulation resistance measurement unit 120 to the ground. Also, when the second circuit is formed, the switch unit 110 controls to connect one end of the insulation resistance measurement unit 120 to the anode terminal of the battery and connect the other end of the insulation resistance measurement unit 120 to the DC power applying unit. The other steps are substantially the same, and thus a repeated description is omitted herein.

According to the present disclosure, quantitative insulation resistance values of the cathode terminal and the anode terminal of the battery may be each obtained. Accordingly, it can be determined whether a breakdown of the insulation condition of the battery occurs, and at which electrode an insulation breakdown phenomenon occurs. Also, a safety accident caused by a leakage current may be prevented by selecting, as a final insulation resistance value, a smaller insulation resistance value among the insulation resistance values of the cathode terminal and the anode terminal.

Meanwhile, in the description of the present disclosure, each component of the apparatus for measuring an insulation resistance shown in FIGS. 1 through 6 should be understood as a logic component rather than a physically distinguishable component.

That is, each component corresponds to a logic component for realizing the technical spirit of the present disclosure, and thus, it should be understood that though each component is integrated or separated, it falls within the scope of the present disclosure if a function performed by a logic component of the present disclosure can be implemented, and it falls within the scope of the present disclosure regardless of whether names are identical or not if it is a component performing an identical or similar function.

The present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for measuring an insulation resistance, the apparatus comprising:
a first insulation resistance measurement unit and a second insulation resistance measurement unit connected to a cathode terminal and an anode terminal of a battery, respectively;
a first switch and a second switch to form different first and second circuits by selectively connecting the first insulation resistance measurement unit and the second insulation resistance measurement unit to the cathode terminal and the anode terminal, respectively;
a voltage detection unit to sense a first insulation detection voltage and a second insulation detection voltage applied to the first insulation resistance measurement unit and the second insulation resistance measurement unit; and
a control unit to calculate, via simultaneous circuit equations derived from the first circuit and the second circuit, a cathode terminal-side insulation resistance value and an anode terminal-side insulation resistance value from the first insulation detection voltage and the second insulation detection voltage,
wherein the second insulation resistance measurement unit further includes a direct current (DC) power applying unit, and
wherein the control unit calculates the following Equations including the simultaneous circuit equations for calculating the cathode terminal-side insulation resistance value and the anode terminal-side insulation resistance value:

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2},$$

where $V_{Bat}$ denotes a battery voltage value, $V_1$ denotes a first insulation detection voltage, $V_2$ denotes a second insulation detection voltage, $V_{DC}$ denotes a voltage value of a DC power applying unit, $R_1$ denotes a first resistance value, $R_2$ denotes a second resistance value, $R_{Leak(+)}$ denotes the cathode terminal-side insulation resistance values, and $R_{Leak(-)}$ denotes the anode terminal-side insulation resistance value.

2. The apparatus according to claim 1, wherein the control unit determines, as a final insulation resistance value, as smaller insulation resistance value among the calculated cathode terminal-side insulation resistance value and the calculated anode terminal-side insulation resistance value.

3. The apparatus according to claim 2, wherein it judges whether an insulation breakdown occurs in the battery by comparing the final insulation resistance value to a preset standard insulation resistance value.

4. The apparatus according to claim 1, further comprising:
a memory unit to store the battery voltage value, the voltage value of the DC power applying unit, the first resistance value, the second resistance value, and the standard insulation resistance value.

5. The apparatus according to claim 1, further comprising:
a transmission unit to form a communication interface with an external device,
wherein the control unit transmits information about whether the insulation breakdown occurs to the external device through the transmission unit.

6. The apparatus according to claim 5, wherein the external device is a battery analysis device or a control device of a system equipped with a battery.

7. The apparatus according to claim 1, further comprising:
a warning unit to visually or auditorily output whether an insulation breakdown occurs,
wherein when an insulation breakdown is sensed, the control unit outputs a warning signal to provide a warning of the insulation breakdown visually or auditorily through the warning unit.

8. An apparatus for measuring an insulation resistance, the apparatus comprising:
an insulation resistance measurement unit connected to a cathode terminal or an anode terminal of a battery;
a switch unit to form different first and second circuits by selectively connecting the insulation resistance measurement unit to the cathode terminal and the anode terminal of the battery;
a voltage detection unit to sense a first insulation detection voltage and a second insulation detection voltage applied to the insulation resistance measurement unit; and
a control unit to calculate, via simultaneous circuit equations derived from the first circuit and the second circuit, a cathode terminal-side insulation resistance value and an anode terminal-side insulation resistance value from the first insulation detection voltage and the second insulation detection voltage,
wherein the switch unit forms different first and second circuits by selectively connecting one end of the insulation resistance measurement unit to the cathode terminal or the anode terminal of the battery and selectively connecting the other end of the insulation resistance measurement unit to a ground or a DC power applying unit, and
wherein the control unit calculates the following Equations including the simultaneous circuit equations for calculating the cathode terminal-side insulation resistance value and the anode terminal-side insulation resistance value;

$$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2},$$

where $V_{Bat}$ denotes a battery voltage value, $V_1$ denotes the first insulation detection voltage, $V_2$ denotes the second insulation detection voltage, $V_{DC}$ denotes a voltage value of a DC power applying unit, $R_1$ denotes a first resistance value, $R_2$ denotes a second resistance value, $R_{Leak(+)}$ denotes the cathode terminal-side insulation resistance value, and $R_{Leak(-)}$ denotes the anode terminal-side insulation resistance value.

9. The apparatus according to claim 8, wherein the switch unit includes a multiplexer (MUX).

10. A method of measuring an insulation resistance of a battery using a first Insulation detection voltage and a second insulation detection voltage detected by a first insulation resistance measurement unit and a second insulation resistance measurement unit connected to a cathode terminal and an anode terminal of the battery respectively, the method comprising:
(a) sensing the first insulation detection voltage after forming a first circuit by connecting the first insulation resistance measurement unit to the cathode terminal of the battery;
(b) sensing the second insulation detection voltage after forming a second circuit by connecting the second insulation resistance measurement unit to the anode terminal of the battery; and
(c) calculating, simultaneous circuit equations derived from the first circuit and the second circuit, a cathode terminal-side insulation resistance value and an anode terminal-side insulation resistance value from the first insulation detection voltage and the second insulation detection voltage,
wherein the second insulation resistance measurement unit includes a direct current (DC) power applying unit, and
wherein the calculating the cathode terminal-side insulation resistance value and the anode terminal-side insulation resistance value comprises calculating the following Equations including the simultaneous circuit equations, $$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2},$$

where $V_{Bat}$ denotes a battery voltage value, $V_1$ denotes a first insulation detection voltage, $V_2$ denotes a second insulation detection voltage, $V_{DC}$ denotes a voltage value of a DC power applying unit, $R_1$ denotes a first resistance value, $R_2$ denotes a second resistance value, $R_{Leak(+)}$ denotes the cathode terminal-side insulation resistance value, and $R_{Leak(-)}$ denotes the anode terminal-side insulation resistance value.

11. The method according to claim 10, further comprising:
    determining, as a final insulation resistance value, a smaller insulation resistance value among the calculated cathode terminal-side insulation resistance value and the calculated anode terminal-side insulation resistance value.

12. The method according to claim 11, wherein the determining the smaller insulation resistance value comprises judging whether an insulation breakdown occurs by comparing the final insulation resistance value to a preset standard insulation resistance value.

13. The method according to claim 12, wherein the determining the smaller insulation resistance value further comprises, transmitting information about whether the insulation breakdown occurs to an external device, when an insulation breakdown is determined to occur.

14. The method according to claim 12, where the determining the smaller insulation resistance value further comprises, providing a visual or auditory warning of the occurrence of the insulation breakdown to a user, an insulation breakdown is determined to occur.

15. The method according to claim 10, further comprising:
    storing the battery voltage value, the voltage value the DC power applying unit, the first resistance value, the second resistance value, and the standard insulation resistance value.

16. A method of measuring an insulation resistance of a battery using a first insulation detection voltage and a second insulation detection voltage detected by an insulation resistance measurement unit connected to a cathode terminal or an anode terminal of the battery, the method comprising:
    (a) sensing the first insulation detection voltage after forming a first circuit by connecting the insulation resistance measurement unit to the cathode terminal of the battery;
    (b) sensing the second insulation detection voltage after forming a second circuit by connecting the insulation resistance measurement unit to the anode terminal of the battery; and
    (c) calculating, via simultaneous circuit equations derived from the first circuit and the second circuit, a cathode terminal-side insulation resistance value and an anode terminal-side insulation resistance value from the first insulation detection voltage and the second insulation detection voltage,
    wherein the sensing the first insulation detection voltage comprises detecting the first insulation detection voltage after forming the first circuit by connecting one end of the insulation resistance measurement unit to the cathode terminal of the battery and the other end of the insulation resistance measurement unit to a ground, and the sensing the second insulation detection voltage comprises detecting the second insulation detection voltage after forming the second circuit by connecting the other end of the insulation resistance measurement unit to the anode terminal of the battery and the other end of the insulation resistance measurement unit to a DC power applying unit, and
    wherein the calculating the cathode terminal-side insulation resistance value and the anode terminal-side insulation resistance value comprises calculating the following Equations including the simultaneous circuit equations, $$R_{Leak(+)} = \frac{(V_{Bat} - A)(V_{Bat} - C) - AC}{D(V_{Bat} - A) + BC}$$

$$R_{Leak(-)} = \frac{(V_{Bat} - A)(V_{Bat} - C) - AC}{B(V_{Bat} - A) + AD}$$

$$\therefore A = \left(\frac{V_1}{R_2}\right)R_1 + V_1$$

$$\therefore B = \frac{V_1}{R_2}$$

$$\therefore C = \left(\frac{V_{DC} - V_2}{R_2}\right)R_1 - V_2$$

$$\therefore D = \frac{V_{DC} - V_2}{R_2},$$

where $V_{Bat}$ denotes a battery voltage value, $V_1$ denotes a first insulation detection voltage, $V_2$ denotes a second insulation detection voltage, $V_{DC}$ denotes a voltage value of a DC power applying unit, $R_1$ denotes a first resistance value, $R_2$ denotes a second resistance value, $R_{Leak(+)}$ denotes the cathode terminal-side insulation resistance value, and $R_{Leak(-)}$ denotes the anode terminal-side insulation resistance value.

* * * * *